(12) United States Patent
Lin et al.

(10) Patent No.: US 12,713,748 B2
(45) Date of Patent: Aug. 18, 2026

(54) ELECTRONIC DEVICE AND MANUFACTURING METHOD THEREOF

(71) Applicant: Innolux Corporation, Miaoli County (TW)

(72) Inventors: Yi-Hung Lin, Miaoli County (TW); Yeong-E Chen, Miaoli County (TW); Yan-Zheng Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 433 days.

(21) Appl. No.: 18/347,584

(22) Filed: Jul. 6, 2023

(65) Prior Publication Data

US 2024/0047633 A1 Feb. 8, 2024

Related U.S. Application Data

(60) Provisional application No. 63/394,624, filed on Aug. 3, 2022.

(30) Foreign Application Priority Data

Apr. 18, 2023 (CN) ......................... 202310415671.3

(51) Int. Cl.
*H10H 20/857* (2025.01)
*H10W 20/20* (2026.01)
(Continued)

(52) U.S. Cl.
CPC .......... *H10H 20/857* (2025.01); *H10W 20/20* (2026.01); *H10W 72/20* (2026.01);
(Continued)

(58) Field of Classification Search
CPC ..................... H01L 24/08; H01L 24/16; H01L 2224/16238; H01L 25/0753;
(Continued)

(56) References Cited

U.S. PATENT DOCUMENTS

2009/0146307 A1 6/2009 Lin et al.
2011/0156248 A1* 6/2011 Matsuki .................. H01L 24/03 257/737

(Continued)

FOREIGN PATENT DOCUMENTS

CN 101917819 12/2010

*Primary Examiner* — Britt Hanley
*Assistant Examiner* — Victor V Barzykin
(74) *Attorney, Agent, or Firm* — JCIPRNET

(57) ABSTRACT

An electronic device and a manufacturing method thereof are provided. The electronic device includes a substrate, a first metal layer, a first insulating layer, a second metal layer, and a second insulating layer. The first metal layer is disposed on the substrate and configured to transmit a ground signal. The first insulating layer is disposed on the first metal layer and includes at least one first opening. The second metal layer is disposed on the first insulating layer and electrically connected to the first metal layer through the at least one first opening. The second insulating layer is disposed on the second metal layer and includes at least one second opening. In the top view direction, the at least one first opening is separated from the at least one second opening. The electronic device in the embodiments of the disclosure and the manufacturing method thereof may improve the process yield.

15 Claims, 10 Drawing Sheets

(51) Int. Cl.

| | |
|---|---|
| ***H10W 72/20*** | (2026.01) |
| ***H10W 90/00*** | (2026.01) |
| *H10H 20/01* | (2025.01) |
| *H10W 72/00* | (2026.01) |
| *H10W 72/90* | (2026.01) |
| *H10W 80/00* | (2026.01) |

(52) U.S. Cl.
CPC ......... *H10W 90/00* (2026.01); *H10W 90/724* (2026.01); *H10H 20/0364* (2025.01); *H10W 72/01212* (2026.01); *H10W 72/221* (2026.01); *H10W 72/234* (2026.01); *H10W 72/932* (2026.01); *H10W 80/732* (2026.01); *H10W 90/722* (2026.01)

(58) Field of Classification Search
CPC . H01L 2224/08055; H01L 2224/16145; H01L 23/481; H01L 24/11; H01L 24/13; H01L 2224/111; H01L 2224/13008; H01L 2224/13016; H10H 20/857; H10H 20/0364; H10W 72/20; H10W 20/20; H10W 90/00; H10W 72/01212; H10W 72/221; H10W 72/234; H10W 72/932; H10W 80/732; H10W 90/722; H10W 90/724
See application file for complete search history.

(56) References Cited

U.S. PATENT DOCUMENTS

| | | | | |
|---|---|---|---|---|
| 2011/0309473 | A1 | 12/2011 | Lin et al. | |
| 2012/0129334 | A1* | 5/2012 | Chung | H01L 24/03 438/653 |
| 2017/0098622 | A1* | 4/2017 | Park | H01L 24/05 |
| 2022/0130685 | A1* | 4/2022 | Lee | H01L 24/05 |

* cited by examiner

ELECTRONIC DEVICE AND MANUFACTURING METHOD THEREOF

CROSS-REFERENCE TO RELATED APPLICATION

This application claims the priority benefits of U.S. provisional application Ser. No. 63/394,624, filed on Aug. 3, 2022, and China application serial no. 202310415671.3, filed on Apr. 18, 2023. The entirety of each of the above-mentioned patent applications is hereby incorporated by reference herein and made a part of this specification.

BACKGROUND

Technical Field

The disclosure relates to an electronic device and a manufacturing method thereof, more particularly to an electronic device that may improve process yield and the manufacturing method thereof.

Description of Related Art

Electronic devices or tiling electronic devices has been widely applied in different fields such as communication, display, vehicle, or aviation. With the vigorous development of electronic devices, the electronic devices are becoming thinner and lighter, which has led to higher requirements for the reliability or quality of the electronic devices.

SUMMARY

The disclosure provides an electronic device and a manufacturing method thereof, which may improve the process yield.

According to the embodiments of the disclosure, the electronic device includes a substrate, a first metal layer, a first insulating layer, a second metal layer, and a second insulating layer. The first metal layer is disposed on the substrate and configured to transmit a ground signal. The first insulating layer is disposed on the first metal layer and includes at least one first opening. The second metal layer is disposed on the first insulating layer and electrically connected to the first metal layer through the at least one first opening. The second insulating layer is disposed on the second metal layer and includes at least one second opening. In the top view direction, at least one first opening is separated from at least one second opening.

According to an embodiment of the disclosure, a manufacturing method of an electronic device is described below. A substrate is provided. A first metal layer is formed on the substrate to transmit a ground signal. A first insulating layer is formed on the first metal layer. The first insulating layer is patterned to form at least one first opening. The second metal layer is formed on the first insulating layer. The second metal layer is electrically connected to the first metal layer through the at least one first opening. The second insulating layer is formed on the second metal layer. The second insulating layer is patterned to form at least one second opening. In the top view direction, the at least one first opening is separated from the at least one second opening.

BRIEF DESCRIPTION OF THE DRAWINGS

The accompanying drawings are included to provide a further understanding of the disclosure, and are incorporated in and constitute a part of this specification. The drawings illustrate embodiments of the disclosure, and together with the description serve to explain principles of the disclosure.

DESCRIPTION OF THE EMBODIMENTS

Figure 1A:
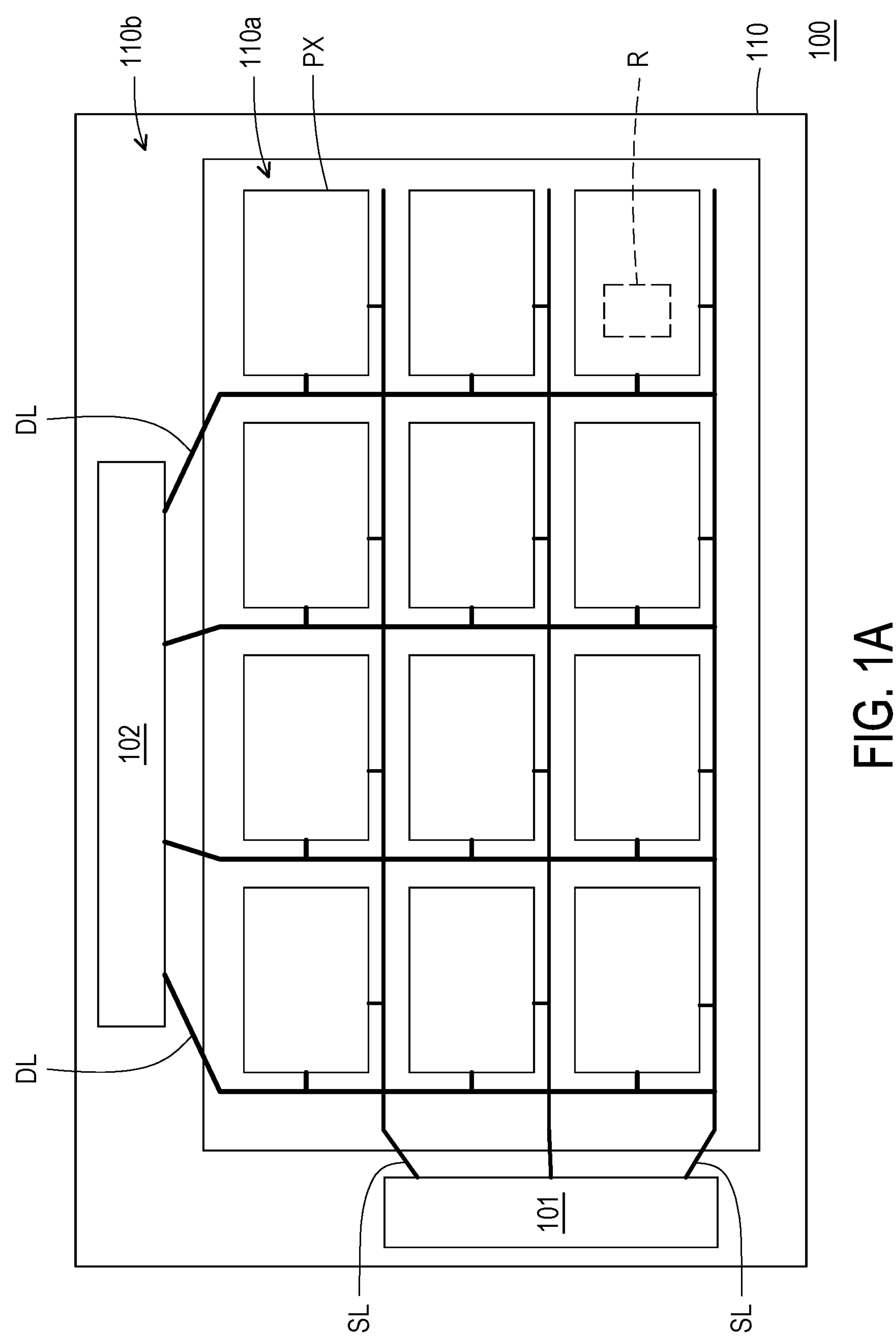
FIG. 1A is a schematic top view of an electronic device according to the first embodiment of the disclosure.

The disclosure can be understood by referring to the following detailed description in conjunction with the accompanying drawings. It should be noted that, for the ease of understanding by the readers and for the brevity of the accompanying drawings, multiple drawings in the disclosure only depict a portion of the electronic device, and the specific elements in the drawings are not drawn according to the actual scale. In addition, the number and size of each of the elements in the figures are for illustration purposes only, and are not intended to limit the scope of the disclosure.

In the following description and claims, words such as "comprising" and "including" are open-ended words, so they should be interpreted as meaning "including but not limited to . . . ".

It should be understood that when an element or layer is referred to as being "on" or "connected to" another element or layer, it may be directly on or directly connected to this other element or layer, or there may be an intervening element or layer in between (indirect case). In contrast, when an element is referred to as being "directly on" or "directly connected to" another element or layer, there are no intervening elements or layers present.

Although the terms "first", "second", "third", . . . , may be used to describe various constituent elements, the constituent elements are not limited by the terms. The terms are only used to distinguish a single constituent element from other constituent elements in the specification. The same terms may not be used in the claim, but replaced by first, second, third . . . according to the order in which the elements are declared in the claim. Therefore, in the following description, the first constituent element may be the second constituent element in the claim.

As used herein, the terms "about," "approximately," "substantially," and "roughly" generally mean within 10%, within 5%, within 3%, within 2%, within 1%, or within 0.5% of a given value or range. The quantity given here is an approximate quantity, that is, even though "about," "approximately," "substantially," and "roughly" are not specified, the meaning of "about," "approximately," "substantially," and "roughly" are still implied.

In some embodiments of the disclosure, terms related to joining and connecting, such as "connected", "interconnected", etc., unless otherwise defined, may mean that two structures are in direct contact, or may also mean that two structures are not in direct contact, in which there are other structures located between these two structures. The terms related to joining and connecting can also include the case where both structures are movable, or both structures are fixed. Furthermore, the term "coupled" includes any direct and indirect means of electrical connection.

In some embodiments of the disclosure, optical microscopy (OM), scanning electron microscope (SEM), film thickness profiler (α-step), ellipsometer, or other suitable methods may be used to measure the area, width, thickness, or height of each element, or the distance or pitch between elements. In detail, according to some embodiments, a scanning electron microscope can be used to obtain a cross-sectional structure image including a component to be measured, and to measure the area, width, thickness, or height of each element, or the distance or pitch between elements.

The electronic device of this disclosure may include a display device, an antenna device, a sensing device, or a tiling device, but is not limited thereto. The electronic device may be a bendable or flexible electronic device. The electronic device may, for example, include a liquid crystal light emitting diode; the light emitting diode may include, for example, an organic light-emitting diode (OLED), a mini light-emitting diode (mini LED), a micro light-emitting diode (micro LED), or a quantum dot light-emitting diode (quantum dot, QD, such as QLED, QDLED), fluorescence, phosphor, or other suitable materials, and the materials can be any arrangement and combination, but not limited thereto. The antenna device may be, for example, a device with communication or/and electromagnetic wave modulation function, such as a liquid crystal antenna, a Wifi router, a reconfigurable intelligent surface device, or a suitable combination of the above, but not limited thereto. The tiling device may be, for example, a display tiling device or an antenna tiling device, but not limited thereto. It should be noted that, the electronic device can be any arrangement and combination of the foregoing, but not limited thereto. Hereinafter, an electronic device is used to illustrate the disclosure, but the disclosure is not limited thereto.

It should be noted that, in the following embodiments, the features in several different embodiments can be replaced, reorganized, and mixed to complete other embodiments without departing from the spirit of the disclosure. As long as the features of the various embodiments do not violate the spirit of the disclosure or conflict with one another, they can be mixed and matched arbitrarily.

References of the exemplary embodiments of the disclosure are to be made in detail. Examples of the exemplary embodiments are illustrated in the drawings. If applicable, the same reference numerals in the drawings and the descriptions indicate the same or similar parts.

Figure 1B:
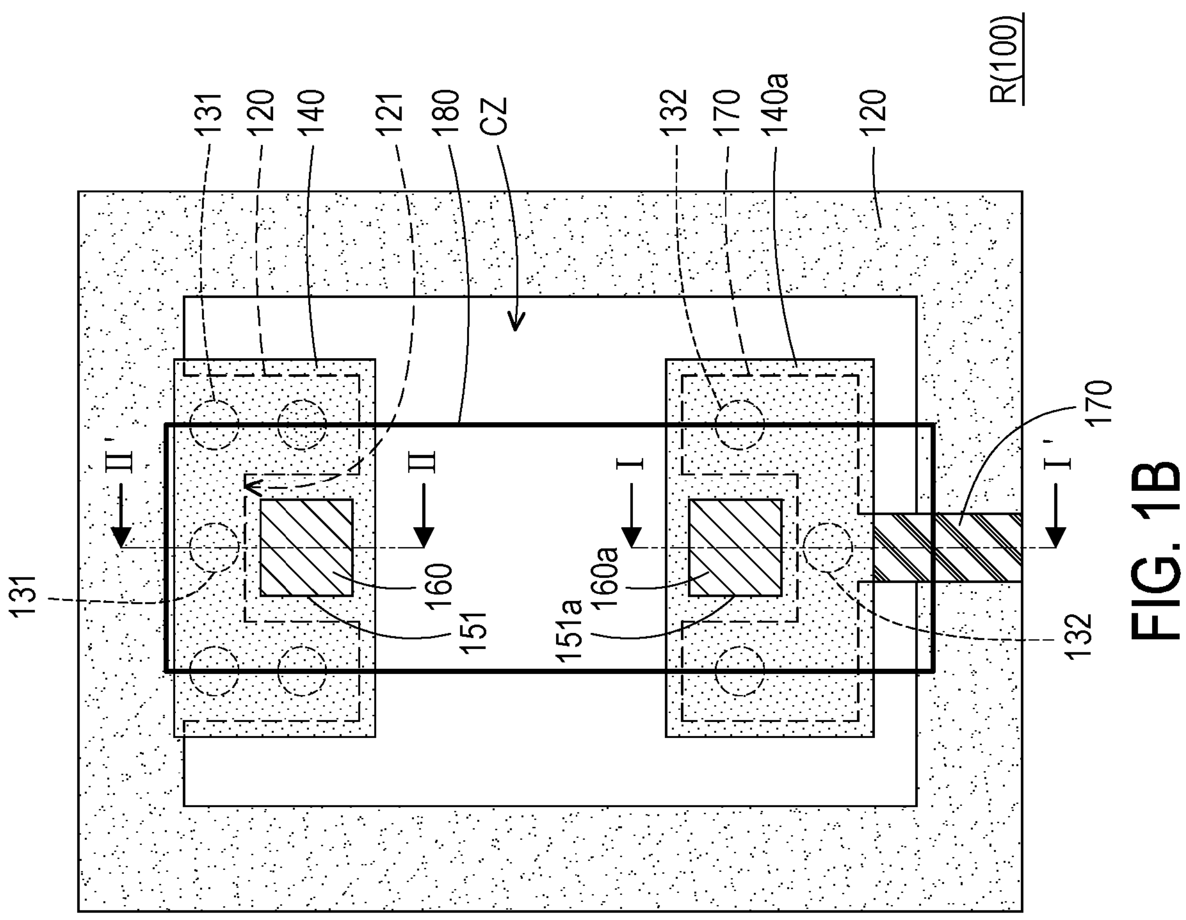
FIG. 1B is an enlarged schematic top view of region R of the electronic device in FIG. 1A.
Figure 1C:
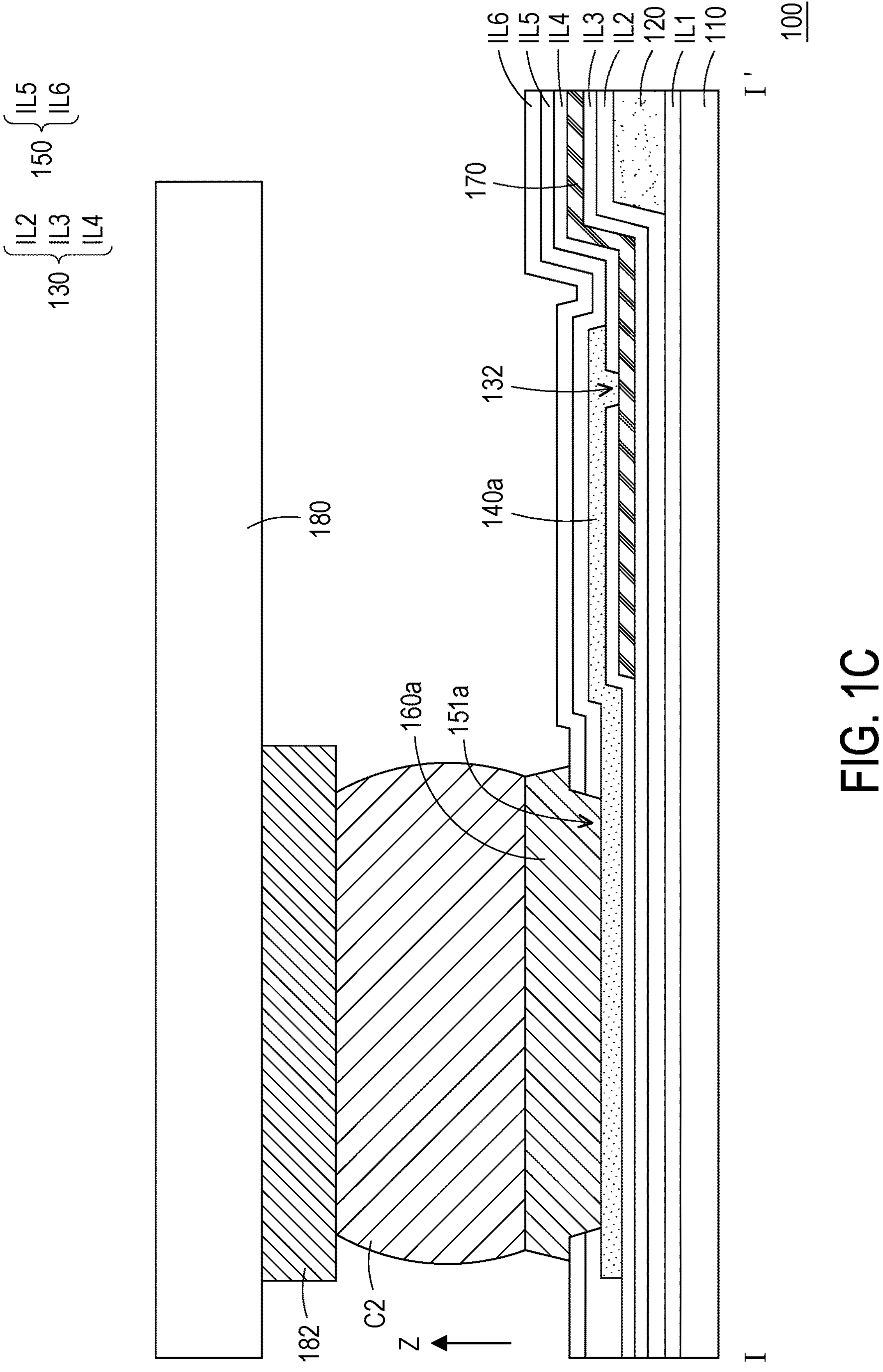
FIG. 1C is a cross-sectional schematic view of the electronic device of FIG. 1B along a profile line I-I'.
Figure 1D:
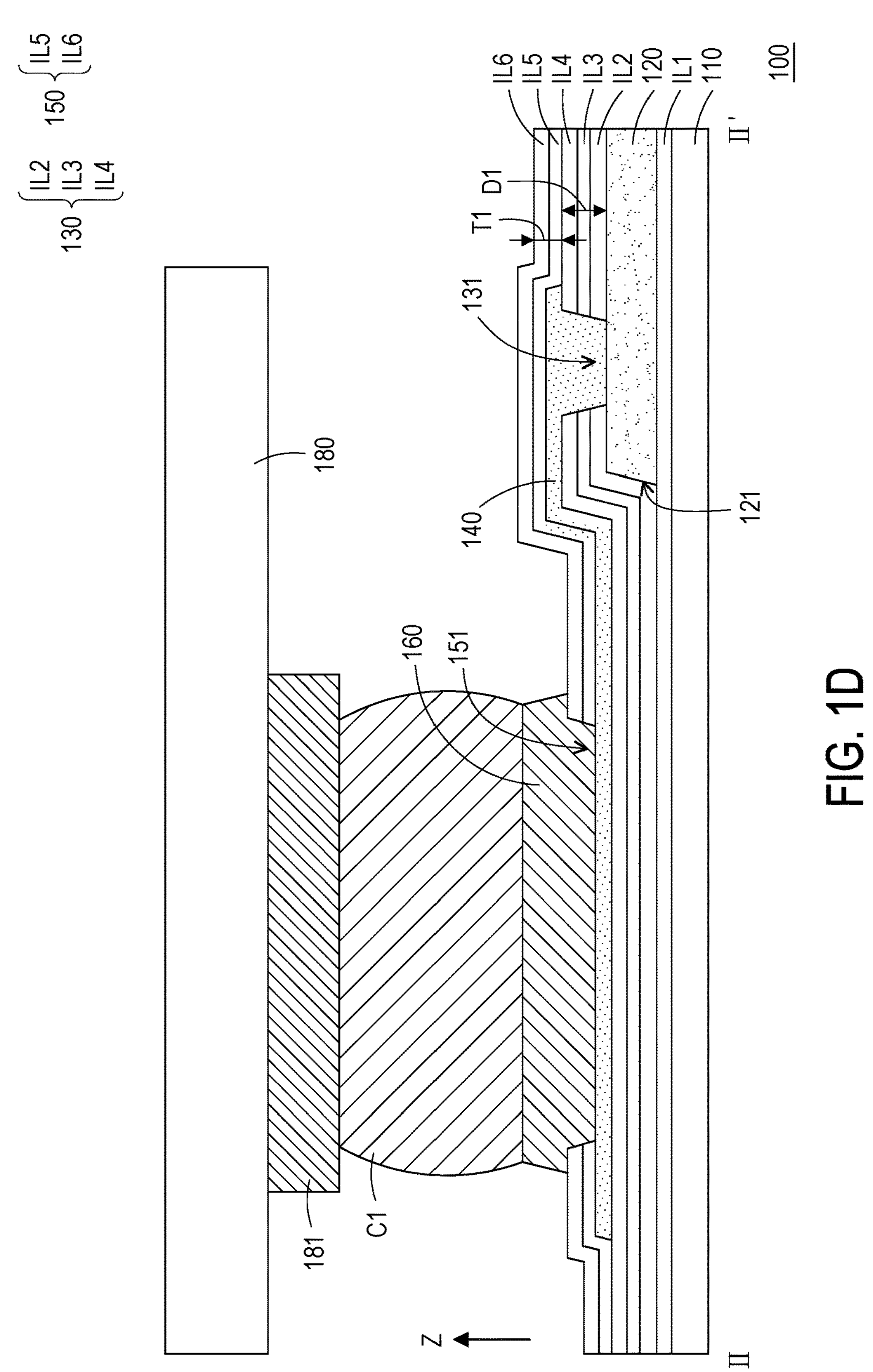
FIG. 1D is a cross-sectional schematic view of the electronic device in FIG. 1B along a profile line II-II'.

FIG. 1A is a schematic top view of an electronic device according to the first embodiment of the disclosure. FIG. 1B is an enlarged schematic top view of region R of the electronic device in FIG. 1A. FIG. 1C is a cross-sectional schematic view of the electronic device of FIG. 1B along a profile line I-I'. FIG. 1D is a cross-sectional schematic view of the electronic device in FIG. 1B along a profile line IME For clarity and convenience of illustration, several elements in an electronic device 100 are omitted in FIG. 1A and FIG. 1B.

First, referring to FIG. 1A to FIG. 1D, the electronic device 100 of this embodiment includes a substrate 110, a first metal layer 120, a first insulating layer 130, second metal layers 140 and 140*a*, a second insulating layer 150, third metal layers 160 and 160*a*, a fourth metal layer 170, and an electronic element 180. In this disclosure, the second metal layers 140 and 140*a* are separated from each other and the third metal layers 160 and 160*a* are separated from each other. The second metal layer 140 is corresponding to the third metal layer 160, and the second metal layer 140*a* is corresponding to the third metal layer 160*a*. In some embodiments, the electronic device 100 further includes an insulating layer ILL a pixel unit PX, a scan line SL, a data line DL, a gate driver 101, and a source driver 102, but not limited thereto.

The substrate 110 has an active region (active region) 110*a* and a region (peripheral region) 110*b*, and the peripheral region 110*b* is adjacent to the active region 110*a*. In some embodiments, the peripheral region 110*b* may surround the active region 110*a*, but not limited thereto. The active region 110*a* may include a clear zone CZ, and the clear zone CZ may be a region where no metal is disposed in the pixel unit PX, but is not limited thereto. The gate driver 101 and the source driver 102 are installed in the peripheral region 110*b*. The gate driver 101 may be electrically connected to the scan line SL, and the source driver 102 may be electrically connected to the data line DL. The gate driver 101 may be, for example, a gate driver IC or a gate on panel (GOP), but is not limited thereto. The source driver 102 may be, for example, a source driver IC, but is not limited thereto. The pixel unit PX, the scan line SL, and the data line DL are disposed in the active region 110*a*. The scan line SL and the data line DL intersect with each other to define the pixel unit PX. The pixel unit PX presents an array arrangement. In addition, in this embodiment, the substrate 110 may include a rigid substrate, a flexible substrate or a combination thereof. For example, the material of the substrate 110 may include glass, quartz, sapphire, ceramic, polycarbonate (PC), polyimide (PI), polyethylene terephthalate (PET), other suitable substrate materials, or a combination of the foregoing, but not limited thereto.

Continuing to refer to FIG. 1B to FIG. 1D, in a region R of the pixel unit PX, the insulating layer IL1 is disposed on the substrate 110. The material of the insulating layer IL1 may include organic material, inorganic material, or a combination of the foregoing, but is not limited thereto.

The first metal layer 120 is disposed on the substrate 110 and on the insulating layer IL1. The first metal layer 120 may be configured to transmit a ground signal. That is, the first metal layer 120 may be used to input and/or output the ground signal.

The first insulating layer 130 is disposed on the first metal layer 120. The first insulating layer 130 may be an insulating layer structure including monolayer or multi-layers. For example, the first insulating layer 130 may include an insulating layer IL2, an insulating layer IL3, and an insulating layer IL4, but not limited thereto. The material of the first insulating layer 130 may include organic material, inorganic material, or a combination of the foregoing, but is not limited thereto.

The first insulating layer 130 may include at least one first opening 131 (FIG. 1B schematically shows five first openings 131, but not limited thereto). For example, as shown in FIG. 1D, the first opening 131 may penetrate the insulating layer IL2, the insulating layer IL3, and the insulating layer IL4. The first opening 131 may overlap with the first metal layer 120 in a normal direction (direction Z) of the substrate 110. The first opening 131 may expose the first metal layer 120, but is not limited thereto. In a top view of the electronic device 100 (e.g., FIG. 1B), the at least one first opening 131 is adjacent to an edge 121 of the first metal layer 120 in the top view direction. In addition, in the top view of the electronic device 100 (e.g., FIG. 1B), the shape of the at least one first opening 131 may be a circular shape in the top view direction, but not limited thereto. In some embodiments, the shape of the at least one first opening 131 may also be at least one of a circular shape, a strip, an inverted U-shape or an annular shape, but not limited thereto. The annular shape includes a closed annular shape and a non-closed annular shape.

In addition, in some embodiments, the first insulating layer 130 may further include at least one opening 132 (FIG. 1B schematically shows three openings 132, but not limited thereto). For example, as shown in FIG. 1C, the opening 132 may penetrate the insulating layer IL4. The opening 132 may overlap with the fourth metal layer 170 in the normal direction (direction Z) of the substrate 110. The opening 132 may expose the fourth metal layer 170.

The fourth metal layer 170 is disposed on the first metal layer 120. The fourth metal layer 170 may be electrically connected to at least a portion of the second metal layer 140*a*. Specifically, the fourth metal layer 170 may be disposed between the second metal layer 140*a* and the first metal layer 120. The fourth metal layer 170 may be disposed between the insulating layer IL4 and the insulating layer IL3. The fourth metal layer 170 may be electrically connected to the second metal layer 140*a* through the opening 132 of the first insulating layer 130 (i.e., the opening 132 of the insulating layer IL4). In addition, although the fourth metal layer 170 of this embodiment may be disposed between the second metal layer 140*a* and the first metal layer 120, the disclosure does not limit the disposing position of the fourth metal layer 170, as long as the fourth metal layer 170 may be electrically connected to the second metal layer 140*a*. In addition, in this embodiment, the fourth metal layer 170 may be configured to transmit a first signal. That is, the fourth metal layer 170 may be configured to input and/or output the first signal. The first signal may include a power signal, a data signal, or a scanning signal, but not limited thereto.

The second metal layers 140 and 140*a* are disposed on the first insulating layer 130. The second metal layers 140 and 140*a* are separated from each other. The second metal layer 140 may also be disposed in the at least one first opening 131, and the second metal layer 140 may be electrically connected to the first metal layer 120 through the at least one first opening 131. The second metal layer 140 may be in contact with the first metal layer 120 through the at least one first opening 131. In this embodiment, the second metal layer 140*a* may also be disposed in the at least one opening 132, and the second metal layer 140*a* may be electrically connected to the fourth metal layer 170 through the at least one opening 132.

The second insulating layer 150 is disposed on the second metal layers 140 and 140*a*. The second insulating layer 150 may be an insulating layer structure including monolayer or multi-layers. For example, the second insulating layer 150 may include an insulating layer IL5 and an insulating layer IL6, but not limited thereto. The material of the second insulating layer 150 may include organic material, inorganic material, or a combination of the foregoing, but is not limited thereto.

The second insulating layer 150 includes at least one second openings 151 and 151*a* (FIG. 1B schematically shows two, but not limited thereto). The second openings 151 and 151*a* are separated from each other. The second openings 151 and 151*a* may penetrate the insulating layer IL5 and the insulating layer IL6. The second opening 151 may expose the second metal layer 140, and the second opening 151*a* may expose the second metal layer 140*a*. In the top view of the electronic device 100 (e.g., FIG. 1B), the at least one first opening 131 and the at least one second openings 151 and 151*a* are separated from each other, or the at least one first opening 131 does not overlap with the at least one second openings 151 and 151*a*. In some embodiments, the shape of the at least one second opening 15*l* and 151*a* may be a circular shape, a strip, an inverted U-shape or an annular shape, but not limited thereto.

In the cross-sectional view of the electronic device 100 (e.g., FIG. 1D), the second insulating layer 150 disposed on the second metal layers 140 and 140*a* has a thickness T1 (i.e., the sum of the thickness of the insulating layer IL5 and the thickness of the insulating layer IL6), and a distance D1 is provided between the second insulating layer 150 and the first metal layer 120. The distance D1 between the second insulating layer 150 and the first metal layer 120 is, for example, greater than 0.5 micrometer (μm) (i.e., D1>0.5 μm). Moreover, the distance D1 is, for example, greater than the thickness T1 of the second insulating layer 150 (i.e., D1>T1), but not limited thereto. The thickness T1 is, for example, a minimum thickness measured by the second insulating layer 150 in the normal direction (direction Z) of the substrate 110. The distance D1 is, for example, a minimum distance between the second insulating layer 150 and the first metal layer 120 in the normal direction (direction Z) of the substrate 110.

The third metal layer 160 is disposed in at least one second opening 151, and the third metal layer 160*a* is disposed in at least one second opening 151*a*. The third metal layer 160 may be electrically connected to the second metal layer 140 through the second opening 151, and the third metal layer 160*a* may be electrically connected to the second metal layer 140*a* through the second opening 151*a*. Specifically, the third metal layer 160 may be electrically connected to the first metal layer 120 through the second opening 151, the second metal layer 140, and the first opening 131 to transmit the ground signal. The third metal layer 160*a* may be electrically connected to the fourth metal layer 170 through the second opening 151*a*, the second metal layer 140*a*, and the opening 132 to transmit the first signal. In this embodiment, the third metal layers 160 and 160*a* may be separated from the first metal layer 120, and the third metal layers 160 and 160*a* may be separated from the first opening 131, but not limited thereto.

The electronic element 180 is disposed on the second insulating layer 150. The electronic element 180 may be electrically connected to the second metal layer 140 through the third metal layer 160 and the second opening 151, and the electronic element 180 may be electrically connected to the second metal layer 140*a* through the third metal layer 160*a* and the second opening 151*a*. In the top view of the electronic device 100 (e.g., FIG. 1B), the electronic element 180 may be disposed corresponding to the clear zone CZ, and the electronic element 180 may partially overlap with the clear zone CZ. In this embodiment, the electronic element 180 may include passive elements and/or active elements, such as capacitors, resistors, inductors, diodes, transistors, etc. The diodes may include light-emitting diodes, photodiodes, or varactor diodes. In some embodiments, the electronic element 180 may be used as a modulation element, such as an element for modulating the phase, frequency, and/or vibration of the electromagnetic wave.

In this embodiment, the electronic element 180 may include at least one first pad 181 and at least one second pad 182. The first pad 181 of the electronic element 180 may be electrically connected to the first metal layer 120 through a conductive member C1 (e.g., a bump), the third metal layer 160, the second opening 151, the second metal layer 140, and the first opening 131. In this way, the electronic element 180 may receive the ground signal. The second pad 182 of the electronic element 180 may be electrically connected to the fourth metal layer 170 through a conductive member C2 (e.g., a bump), the third metal layer 160*a*, the second opening 151*a*, the second metal layer 140*a* and the opening 132. In this way, the electronic element 180 may receive the first signal (including power signal, data signal, or scanning signal).

In this embodiment, the manufacturing method of the electronic device 100 may be described below, but is not limited thereto. A substrate 110 is provided. A first metal layer 120 is formed on the substrate 110 to transmit a ground signal by using the first metal layer 120. A first insulating layer 130 is formed on the first metal layer 120. The first insulating layer 130 is patterned to form the at least one first opening 131. The second metal layers 140 and 140*a* are formed on the first insulating layer 130, respectively. The second metal layer 140 is electrically connected to the first metal layer 120 through the at least one first opening 131. The second insulating layer 150 is formed on the second metal layers 140 and 140*a*. The second insulating layer 150 is patterned to form the at least one second openings 151 and 151*a*. The third metal layers 160 and 160*a* are respectively formed in the at least one second openings 151 and 151*a* and on the second insulating layer 150, so that the third metal layers 160 and 160*a* may be respectively electrically connected to the second metal layers 140 and 140*a*. In this embodiment, the second metal layers 140 and 140*a* are formed at the same process and separated from each other, the second openings 151 and 151*a* are formed at the same process and separated from each other, and the third metal layers 160 and 160*a* are formed at the same process and separated from each other. In this embodiment, the manufacturing method of the electronic device 100 may be further described below, but is not limited thereto. The fourth metal layer 170 is formed on the first metal layer 120, so that the fourth metal layer 170 may be electrically connected to at least a portion of the second metal layer 140*a*. The third metal layer 160 may be electrically connected to the first metal layer 120 through the second opening 151, the second metal layer 140, and the first opening 131 to transmit the ground signal. The third metal layer 160*a* may be electrically connected to the fourth metal layer 170 through the second opening 151*a*, the second metal layer 140*a*, and the opening 132 to transmit the first signal. In this embodiment, the methods for forming the first metal layer 120, the second metal layers 140 and 140*a*, the third metal layers 160 and 160*a*, and the fourth metal layer 170 may include, for example, electroless plating, electroplating, chemical vapor deposition, sputtering, resistive thermal evaporation, electron beam evaporation, physical vapor deposition (PVD), other suitable methods, or any combination of the foregoing, but not limited thereto. In addition, the methods for forming different metal layers may be different. For example, the third metal layer may be formed by electroless plating and/or electroplating, which is different from the methods for forming the other metal layers (e.g., first metal layer, second metal layer, or fourth metal layer), but not limited thereto.

In general electronic devices (e.g., high-frequency products, but not limited thereto), the first metal layer that provides the ground signal is usually located in the middle and lower layers, and the third metal layer is usually directly electrically connected to the first metal layer by penetrating the second insulating layer and the first insulating layer simultaneously. Thus, in response to forming an opening that may penetrate both the second insulating layer and the first insulating layer simultaneously, the difficulty of the process is increased due to the great depth of the opening, resulting in a poor process yield. Thus, in the electronic device 100 of this embodiment, the third metal layer 160 may still electrically connected to the first metal layer 120 through the second opening 151, the second metal layer 140, and the first opening 131 without forming a deep opening that may penetrate the second insulating layer and the first insulating layer simultaneously, thereby improving the process yield.

In addition, in the electronic device 100 of this embodiment, since the second opening 151 may be separated from the first opening 131, the problem of metal peeling of the first metal layer 120 and the second metal layer 140 in subsequent processes (e.g., forming the third metal layer 160 and 160*a*) may be reduced or avoided. In some embodiments, at least a portion of the second opening may overlap with the first opening, and the first opening may be larger or smaller than the second opening.

In the electronic device 100 of this embodiment (e.g., high-frequency products, but not limited thereto), since the amount of the first opening 131 may be two or more, the contact area between the second metal layer 140 and the first metal layer 120 may be increased, and the impedance or noise between the third metal layer 160 and the first metal layer 120 may be reduced.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2A:
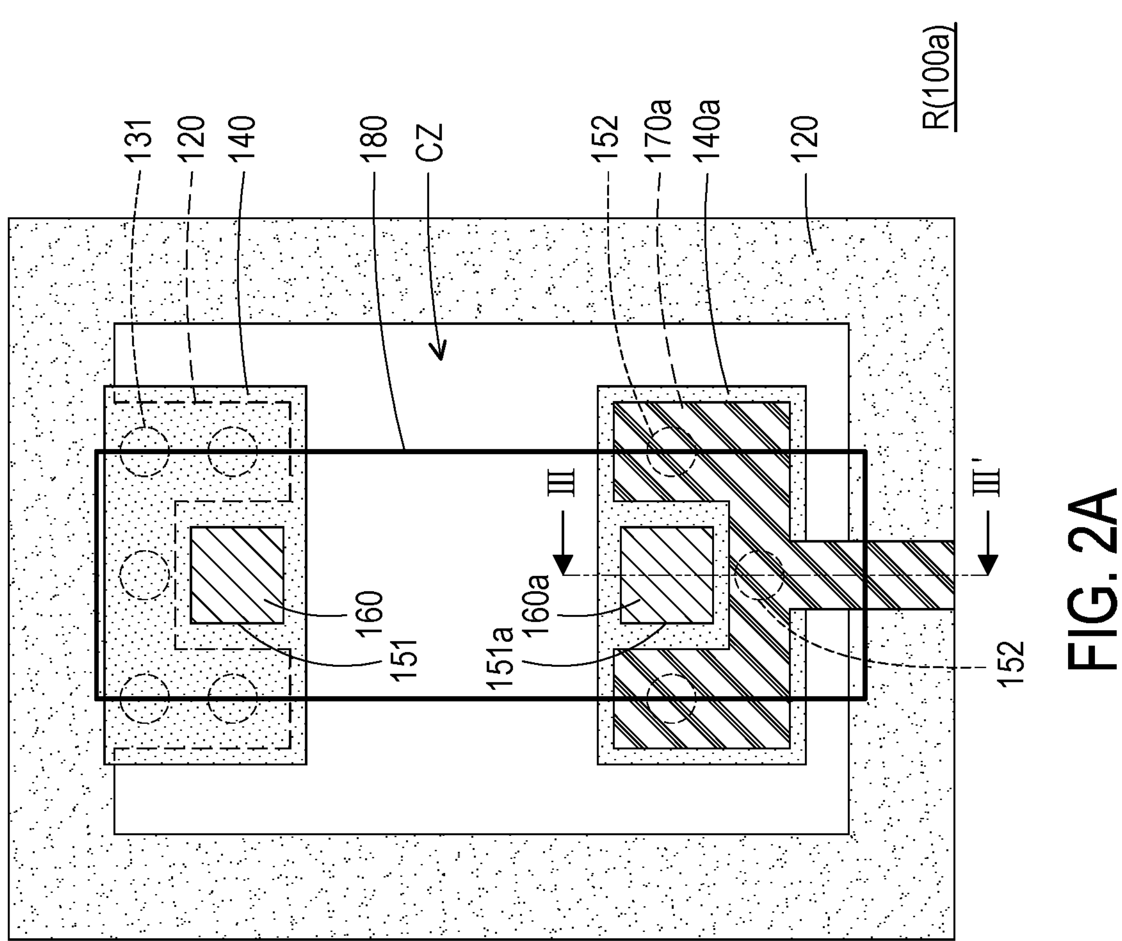
FIG. 2A is an enlarged schematic top view of region R of an electronic device according to the second embodiment of the disclosure.
Figure 2B:
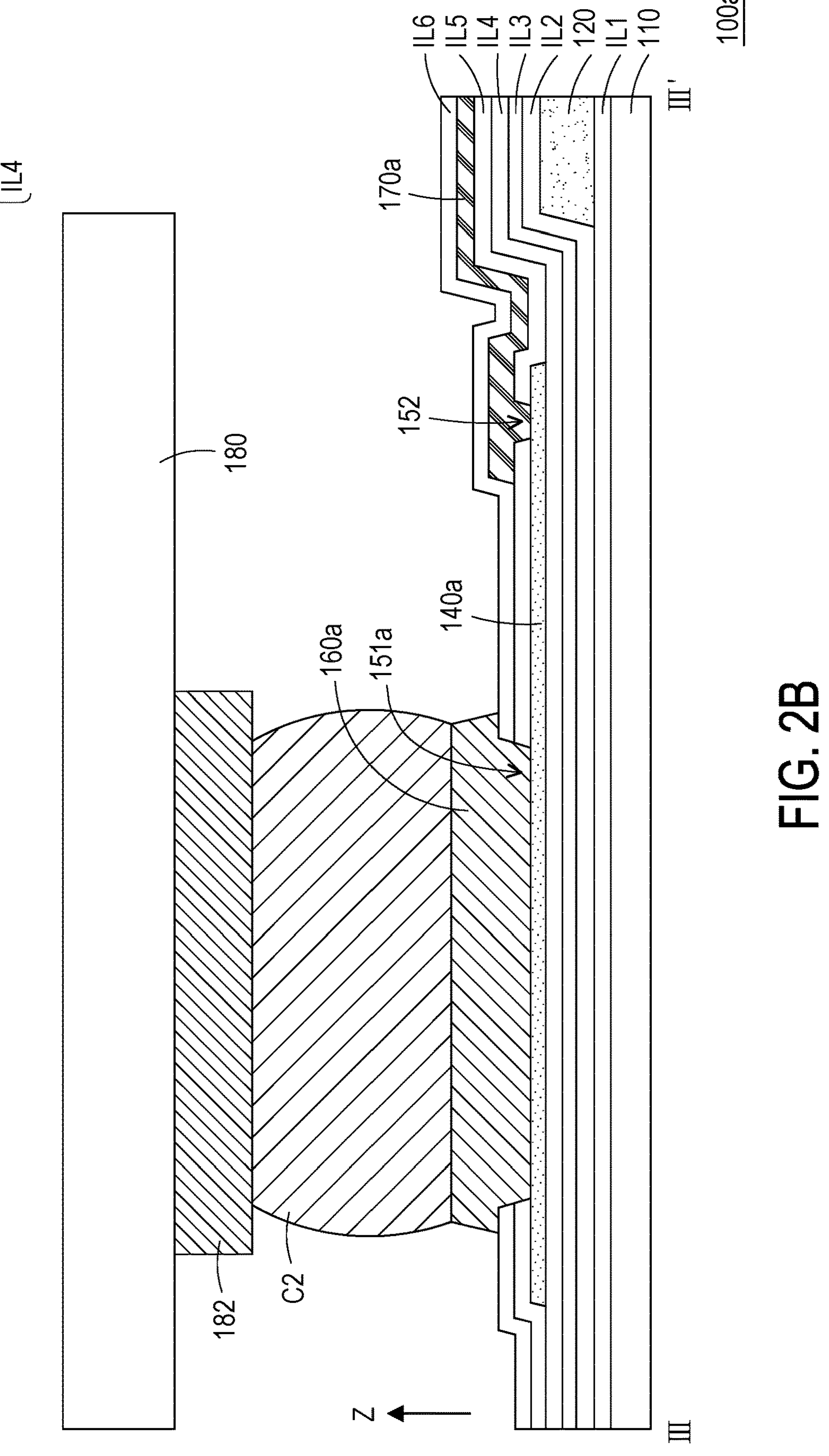
FIG. 2B is a cross-sectional schematic view of the electronic device in FIG. 2A along a profile line III-III'.

FIG. 2A is an enlarged schematic top view of region R of an electronic device according to the second embodiment of the disclosure. FIG. 2B is a cross-sectional schematic view of the electronic device in FIG. 2A along a profile line Referring to FIG. 1B to FIG. 1C and FIG. 2A to FIG. 2B together, an electronic device 100*a* of this embodiment is similar to the electronic device 100 in FIG. 1A, but the difference between the two is that in the electronic device 100*a* of this embodiment, a fourth metal layer 170*a* is disposed on a second metal layer 140*a* to meet the product design requirements for different stacked processes.

Specifically, referring to FIG. 2A and FIG. 2B together, in this embodiment, the first insulating layer 130*a* and the second insulating layer 150 are insulating layer structures having monolayer or multi-layers. For example, the first insulating layer 130*a* may include the insulating layer IL2, the insulating layer IL3, and the insulating layer IL4, and the second insulating layer 150 may include the insulating layer IL5 and the insulating layer IL6, but not limited thereto. In this embodiment, the second insulating layer 150 includes at least one second openings 151 and 151*a* (FIG. 2A schematically shows two, but not limited thereto). The second openings 151 and 151*a* are separated from each other. The second openings 151 and 151*a* may penetrate the insulating layer IL5 and the insulating layer IL6. The second opening 151*a* may expose the second metal layer 140*a*. The second insulating layer 150 further includes an opening 152 (i.e., the opening 152 of the insulating layer IL5). The opening 152 may penetrate the insulating layer IL5. The opening 152 may overlap with the second metal layer 140*a* in the normal direction (direction Z) of the substrate 110. The opening 152 may expose the second metal layer 140*a*.

The fourth metal layer 170*a* may be disposed between the electronic element 180 and the second metal layer 140*a*, and the fourth metal layer 170*a* may be disposed between the insulating layer IL6 and the insulating layer IL5. The fourth metal layer 170*a* may be electrically connected to the second metal layer 140*a* through the opening 152 of the second insulating layer 150. That is, the third metal layer 160*a* may be electrically connected to the fourth metal layer 170*a* through the second opening 151*a*, the second metal layer 140*a*, and the opening 152.

Figure 3:
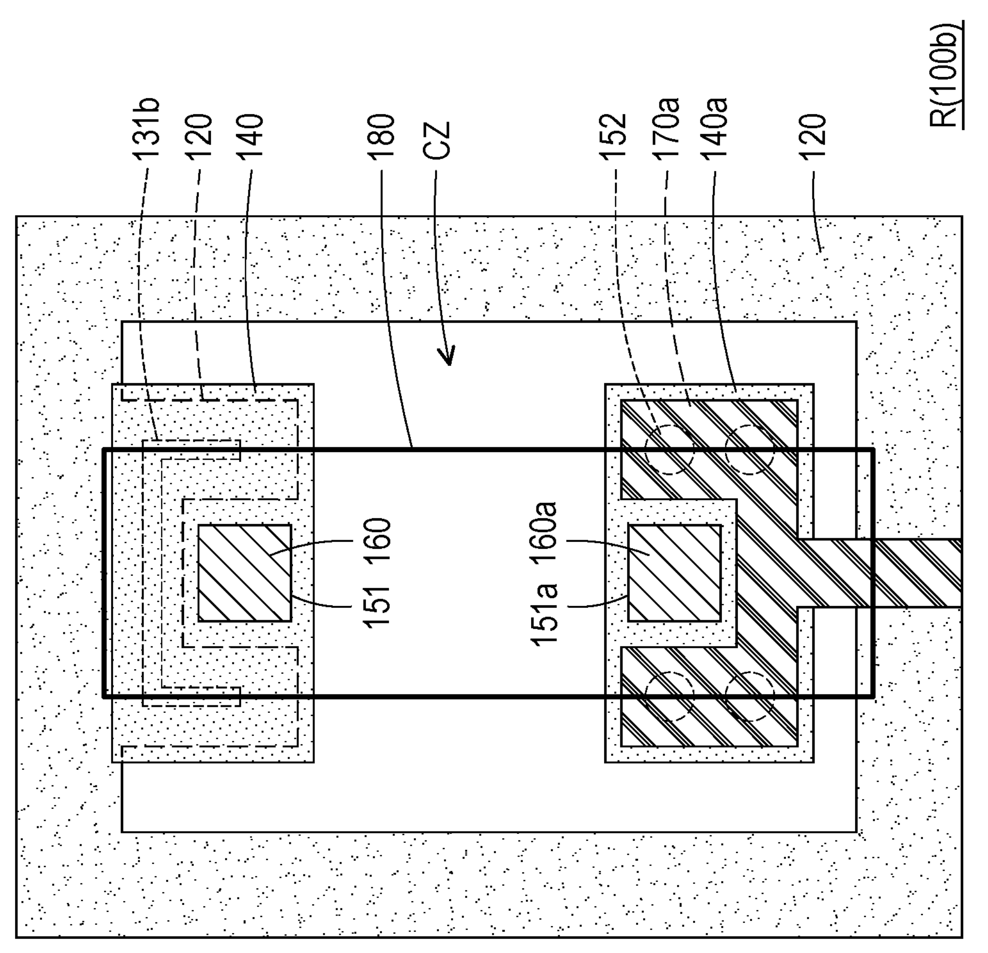
FIG. 3 is an enlarged schematic top view of region R of an electronic device according to the third embodiment of the disclosure.

FIG. 3 is an enlarged schematic top view of region R of an electronic device according to the third embodiment of the disclosure. Referring to FIG. 2A and FIG. 3 together, an electronic device 100*b* of this embodiment is similar to the electronic device 100*a* in FIG. 2A, but the difference between the two is that in the top view of the electronic device 100*b* of this embodiment, the shape of the first opening 131*b* may be a strip or an inverted U-shape in the top view direction. With this design, the contact area between the second metal layer 140 and the first metal layer 120 may be increased to reduce the impedance or noise between the third metal layer 160 and the first metal layer 120. In addition, compared to the circular-shaped first openings 131 in the electronic device 100*a* of FIG. 2A, the design of the inverted U-shaped first opening 131*b* in the electronic device 100*b* of this embodiment may improve the shielding effect for the electromagnetic wave, so as to reduce the electromagnetic wave scattering from the gap between two adjacent circular-shaped first openings 131.

In addition, in this embodiment, although the fourth metal layer 170*a* may be disposed on the second metal layer 140*a*, the disclosure does not limit the disposing position of the fourth metal layer 170*a*, as long as the fourth metal layer 170*a* may be electrically connected to the second metal layer 140*a*. For example, according to some embodiments that are not shown, the fourth metal layer may also be disposed between the second metal layer and the first metal layer.

Figure 4:
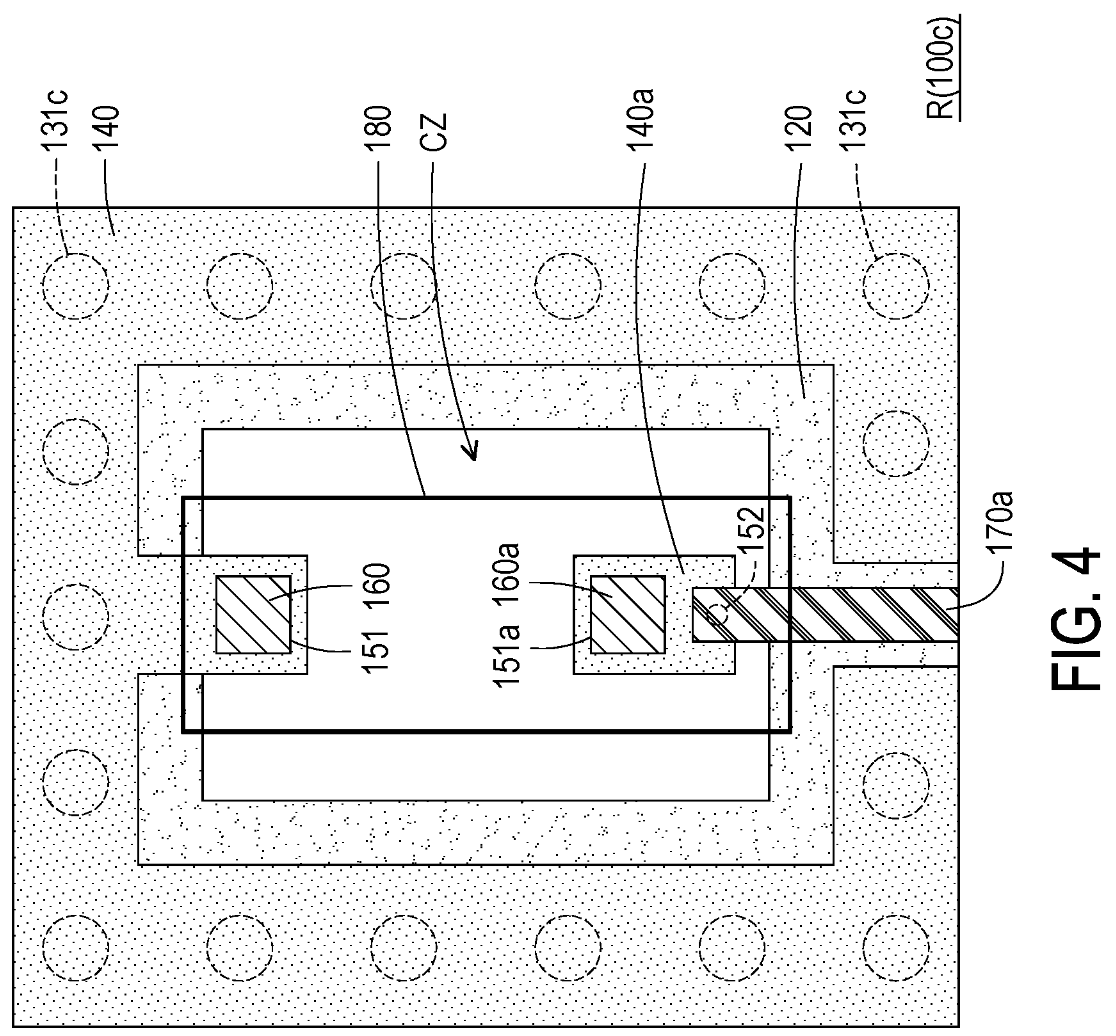
FIG. 4 is an enlarged schematic top view of region R of an electronic device according to the fourth embodiment of the disclosure.

FIG. 4 is an enlarged schematic top view of region R of an electronic device according to the fourth embodiment of the disclosure. Referring to FIG. 1B and FIG. 3 together, an electronic device 100*c* of this embodiment is similar to the electronic device 100 in FIG. 1B, but the difference between the two is that in the electronic device 100*c* of this embodiment, in the top view direction, multiple first openings 131*c* may be disposed in the periphery of the electronic element 180 and may substantially surround the electronic element 180. With this design, the contact area between the second metal layer 140 and the first metal layer 120 may be increased to reduce the impedance or noise between the third metal layer 160 and the first metal layer 120.

In addition, in this embodiment, although the fourth metal layer 170*a* may be disposed on the second metal layer 140*a*, the disclosure does not limit the disposing position of the fourth metal layer 170*a*, as long as the fourth metal layer 170*a* may be electrically connected to the second metal layer 140*a*. For example, according to some embodiments that are not shown, the fourth metal layer may also be disposed between the second metal layer and the first metal layer.

Figure 5:
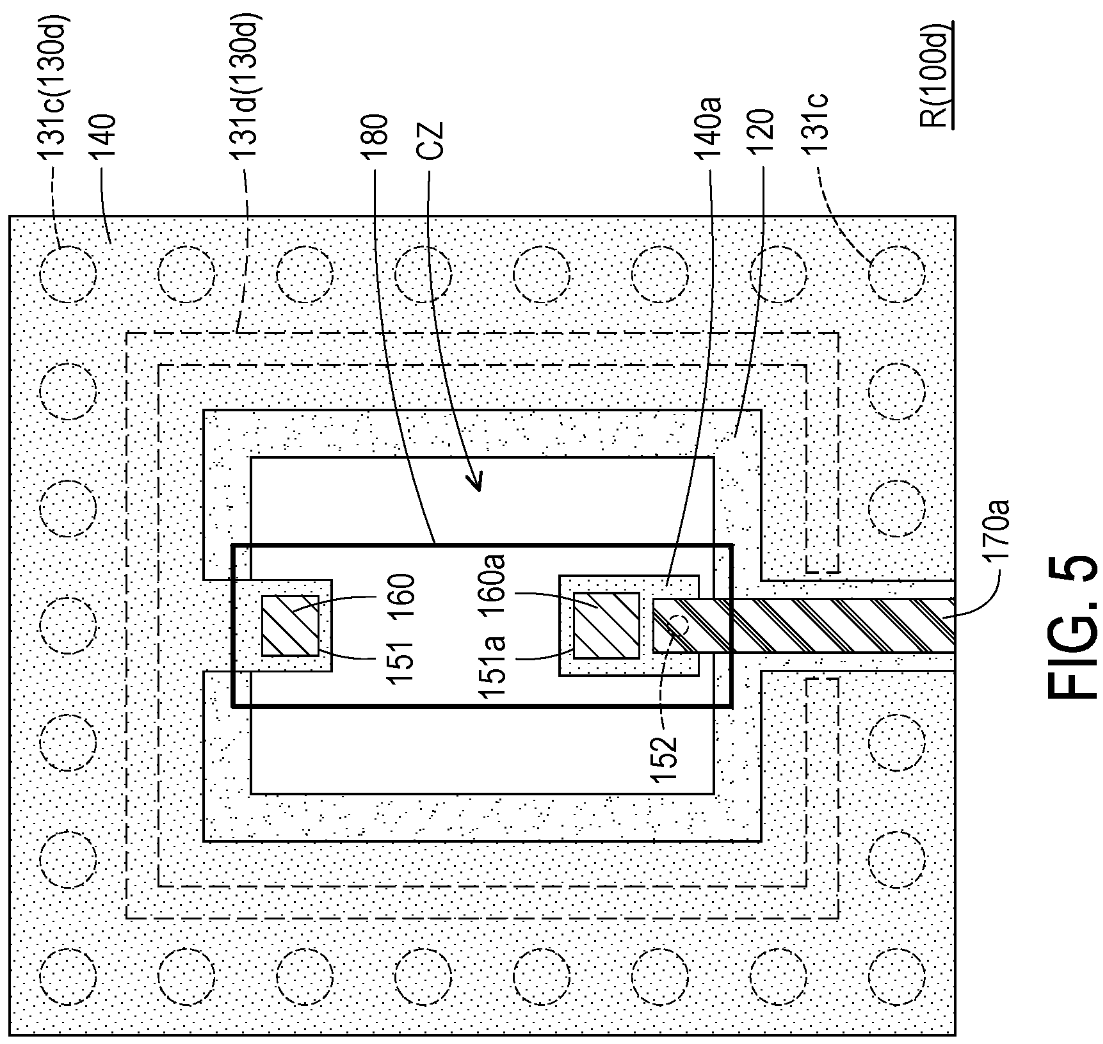
FIG. 5 is an enlarged schematic top view of region R of an electronic device according to the fifth embodiment of the disclosure.

FIG. 5 is an enlarged schematic top view of region R of an electronic device according to the fifth embodiment of the disclosure. Referring to FIG. 4 and FIG. 5 together, an electronic device 100*d* of this embodiment is similar to the electronic device 100*c* in FIG. 4, but the difference between the two is that in the electronic device 100*d* of this embodiment, a first insulating layer 130*d* further includes a first opening 131*d*.

Specifically, referring to FIG. 5, in this embodiment, the first insulating layer 130*d* may include multiple first openings 131*c* and first openings 131*d*, and the first metal layer 120 may be exposed by the first openings 131*c* and the first openings 131*d*. In the top view direction, the shape of the first openings 131*c* is a circular shape, and the first openings 131*c* may be disposed in the periphery of the electronic element 180 and may substantially surround the electronic element 180. In addition, in the top view direction, the shape of the first opening 131*d* is a non-closed annular shape, and the first opening 131*d* may be disposed in the periphery of the electronic element 180 and may substantially surround the electronic element 180.

In this embodiment, by disposing the annular-shaped first opening 131*d*, the contact area between the second metal layer 140 and the first metal layer 120 may be increased to reduce the impedance or noise between the third metal layer 160 and the first metal layer 120. In addition, since the electromagnetic wave may scatter from the gap between two adjacent circular-shaped first openings 131*c*, the configuration of the annular-shaped first opening 131*d* may be used to improve the shielding effect for the electromagnetic wave.

In addition, in this embodiment, although the fourth metal layer 170*a* may be disposed on the second metal layer 140*a*, the disclosure does not limit the disposing position of the fourth metal layer 170*a*, as long as the fourth metal layer 170*a* may be electrically connected to the second metal layer 140*a*. For example, according to some embodiments that are not shown, the fourth metal layer may also be disposed between the second metal layer and the first metal layer.

Figure 6:
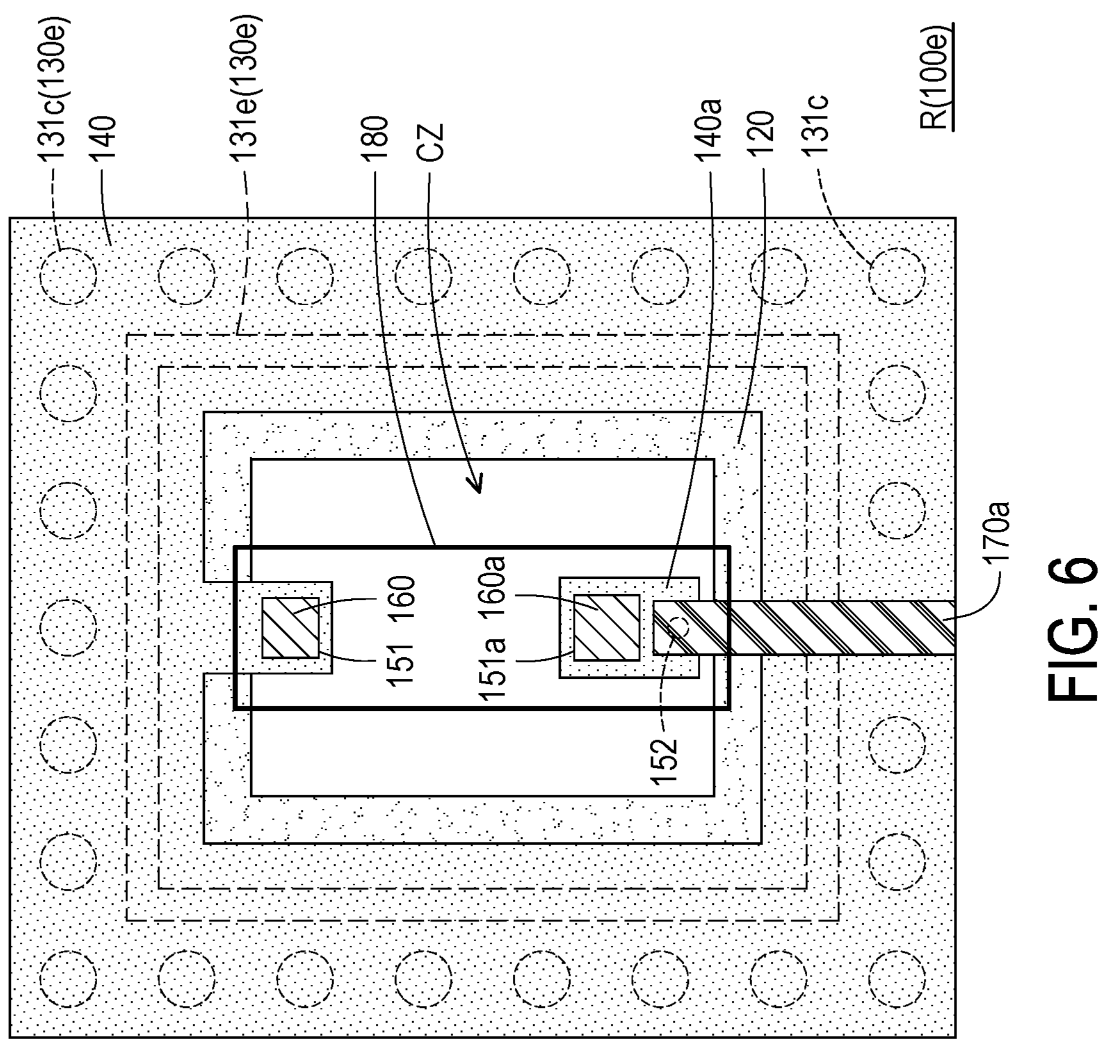
FIG. 6 is an enlarged schematic top view of region R of an electronic device according to the sixth embodiment of the disclosure.

FIG. 6 is an enlarged schematic top view of region R of an electronic device according to the sixth embodiment of the disclosure. Referring to FIG. 5 and FIG. 6 together, an electronic device 100*e* of this embodiment is similar to the electronic device 100*d* in FIG. 5, but the difference between the two is that in the electronic device 100*e* of this embodiment, in the top view direction, the shape of a first opening 131*e* of a first insulating layer 130*e* is a closed annular shape, and the first opening 131*e* may be disposed in the periphery of the electronic element 180 and may substantially surround the electronic element 180. In this way, it may be used to meet the product design requirements for different stacked processes.

In addition, in this embodiment, although the fourth metal layer 170*a* may be disposed on the second metal layer 140*a*, the disclosure does not limit the disposing position of the fourth metal layer 170*a*, as long as the fourth metal layer 170*a* may be electrically connected to the second metal layer 140*a*. For example, according to some embodiments that are not shown, the fourth metal layer may also be disposed between the second metal layer and the first metal layer.

To sum up, in the electronic device and the manufacturing method thereof in the embodiments of the disclosure, the third metal layer may still be electrically connected to the first metal layer through the second opening, the second metal layer, and the first opening without forming a deep opening that may penetrate the second insulating layer and the first insulating layer simultaneously, thereby improving the process yield. In addition, in this embodiment, since the second opening may be separated from the first opening, the problem of metal peeling of the first metal layer 120 and the second metal layer 140 in subsequent processes (e.g., forming the third metal layer 160 and 160*a*) may be reduced or avoided. Moreover, in some embodiments, since the amount of the first opening may be two or more, the impedance or noise between the third metal layer and the first metal layer may be reduced.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments can still be modified, or parts or all of the technical features thereof can be equivalently replaced; however, these modifications or substitutions do not deviate the essence of the corresponding technical solutions from the scope of the technical solutions of the embodiments of the disclosure.

What is claimed is:

1. An electronic device, comprising:

a substrate;

a first metal layer, disposed on the substrate and configured to transmit a ground signal;

a first insulating layer, disposed on the first metal layer and comprising at least one first opening;

a second metal layer, disposed on the first insulating layer and a first portion of the second metal layer electrically connected to the first metal layer through the at least one first opening;

a second insulating layer, disposed on the second metal layer and comprising at least one second opening;

a third metal layer, disposed in the at least one second opening and electrically connected to the second metal layer; and an electronic element, disposed on the second insulating layer and electrically connected to the second metal layer through the third metal layer and the at least one second opening, wherein in a top view direction, the at least one first opening is separated from the at least one second opening, the at least one first opening is disposed in a periphery of the electronic element, and the electronic element does not overlap with the at least one first opening.

2. The electronic device according to claim 1, wherein a distance between the second insulating layer and the first metal layer is greater than 0.5 micrometer.

3. The electronic device according to claim 2, wherein the distance is greater than a thickness of the second insulating layer.

4. The electronic device according to claim 1, wherein the at least one first opening is adjacent to an edge of the first metal layer in the top view direction.

5. The electronic device according to claim 1, wherein in the top view direction, the at least one first opening is at least one of a circular shape, a strip, an inverted U-shape and an annular shape.

6. The electronic device according to claim 1, wherein the at least one first opening is a plurality of first openings.

7. The electronic device according to claim 1, wherein the third metal layer is separated from the first metal layer.

8. The electronic device according to claim 1, wherein the third metal layer is separated from the at least one first opening.

9. The electronic device according to claim 1, wherein the substrate comprises a clear zone, and the clear zone corresponds to the electronic element.

10. The electronic device according to claim 1, further comprising:

a fourth metal layer, disposed on the first metal layer and electrically connected to a second portion of the second metal layer to transmit a first signal.

11. The electronic device according to claim 10, wherein the first portion of the second metal layer and the second portion of the second metal layer are separated from each other.

12. The electronic device according to claim 10, wherein the fourth metal layer is disposed between the second metal layer and the first metal layer, and the fourth metal layer is electrically connected to the second portion of the second metal layer.

13. The electronic device according to claim 10, wherein the fourth metal layer is disposed on the second metal layer, and the fourth metal layer is electrically connected to the second portion of the second metal layer.

14. A manufacturing method of an electronic device, comprising providing a substrate;

forming a first metal layer on the substrate to transmit a ground signal;

forming a first insulating layer on the first metal layer;

patterning the first insulating layer to form at least one first opening;

forming a second metal layer on the first insulating layer, wherein a first portion of the second metal layer is electrically connected to the first metal layer through the at least one first opening;

forming a second insulating layer on the second metal layer;

patterning the second insulating layer to form at least one second opening;

forming a third metal layer in the at least one second opening, so that the third metal layer is electrically connected to the second metal layer; and disposing an electronic element on the second insulating layer, so that the electronic element is electrically connected to the second metal layer through the third metal layer and the at least one second opening, wherein in a top view direction, the at least one first opening is separated from the at least one second opening, the at least one first opening is disposed in a periphery of the electronic element, and the electronic element does not overlap with the at least one first opening.

15. The manufacturing method according to claim 14, further comprising:

forming a fourth metal layer on the first metal layer, so that the fourth metal layer is electrically connected to a second portion of the second metal layer.

* * * * *